United States Patent
Frisina et al.

[11] Patent Number: 6,040,609
[45] Date of Patent: Mar. 21, 2000

[54] PROCESS FOR INTEGRATING, IN A SINGLE SEMICONDUCTOR CHIP, MOS TECHNOLOGY DEVICES WITH DIFFERENT THRESHOLD VOLTAGES

[75] Inventors: Ferruccio Frisina, Sant'Agata Li Battiati; Davide Bolognesi, Argenta; Angelo Magri', Belpasso, all of Italy

[73] Assignee: STMicroelectronics S.r.l., Agrate Brianza, Italy

[21] Appl. No.: 09/178,369

[22] Filed: Oct. 23, 1998

[30] Foreign Application Priority Data

Oct. 24, 1997 [EP] European Pat. Off. ............. 97830543

[51] Int. Cl.$^7$ .................................................. H01L 29/76
[52] U.S. Cl. ...................... 257/391; 257/392; 257/153; 257/401
[58] Field of Search .................... 257/401, 392, 257/402, 153, 391; 438/163, 275

[56] References Cited

U.S. PATENT DOCUMENTS

| | | | |
|---|---|---|---|
| 4,941,027 | 7/1990 | Beasom | 357/23.12 |
| 5,132,757 | 7/1992 | Tignor et al. | 357/233 |
| 5,521,410 | 5/1996 | Yamamoto | 257/342 |
| 5,612,565 | 3/1997 | Kusumoto | 257/401 |
| 5,635,742 | 6/1997 | Hoshi et al. | 257/337 |
| 5,757,046 | 5/1998 | Fujihara et al. | 257/339 |
| 5,796,149 | 8/1998 | Sugaya et al. | 257/401 |
| 5,886,363 | 3/1999 | Hamada et al. | 257/48 |
| 5,900,666 | 5/1999 | Gardner et al. | 257/401 |
| 5,952,699 | 9/1999 | Yamazaki et al. | 257/404 |
| 5,956,582 | 9/1999 | Ayela et al. | 438/206 |
| 5,965,925 | 10/1999 | Kornachuk et al. | 257/401 |

FOREIGN PATENT DOCUMENTS

| | | | |
|---|---|---|---|
| 0 452 814 A1 | 10/1991 | European Pat. Off. | 257/392 |
| 0 772 242 A1 | 5/1997 | European Pat. Off. | 257/392 |
| 0 791 965 A2 | 8/1997 | European Pat. Off. | 257/392 |

*Primary Examiner*—Donald L. Monin, Jr.
*Attorney, Agent, or Firm*—Theodore E. Galanthay; David V. Carlson; Seed IP Law Group PLLC

[57] ABSTRACT

Process for integrating in a same MOS technology devices with different threshold voltages. Simultaneously forming on a semiconductor material layer of at least two gate electrodes for at least two MOS devices, said gate electrodes comprising substantially rectilinear portions and corners, each gate electrode having a respective corner density for unit area. Selectively introducing in the semiconductor material layer a dopant for the simultaneous formation of respective channel regions for said at least two MOS devices, said channel regions extending under the respective gate electrode, said selective introduction using as a mask the respective gate electrodes so that said channel regions have, at the corners of the respective gate electrode, a dopant concentration lower than that at the substantially rectilinear portions. Said two MOS devices consequently have respective threshold voltages that depend on the corner density for unit area and on the aperture angles of the corner of the respective gate electrodes.

18 Claims, 5 Drawing Sheets

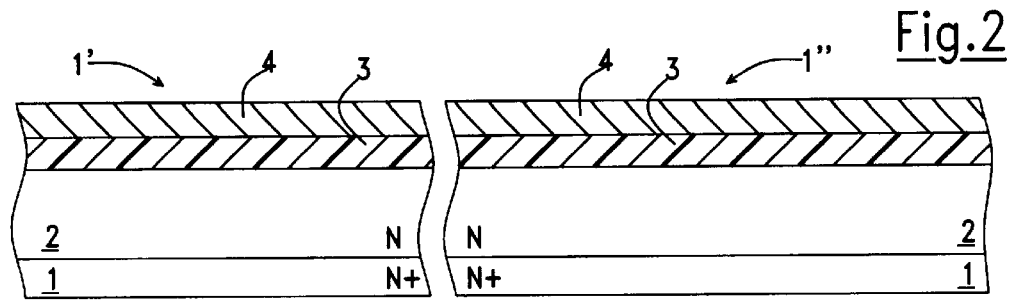
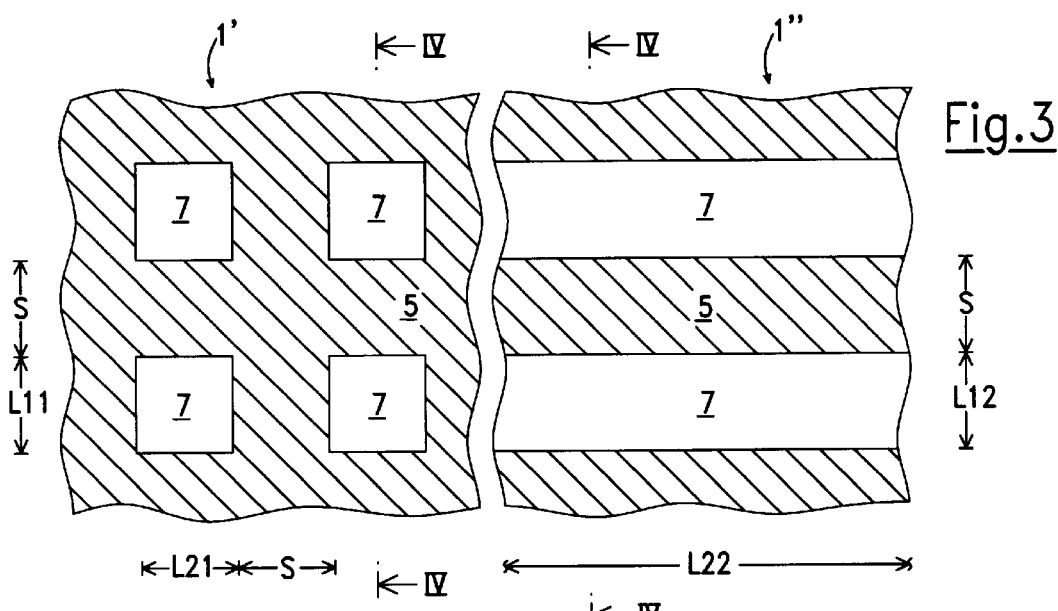
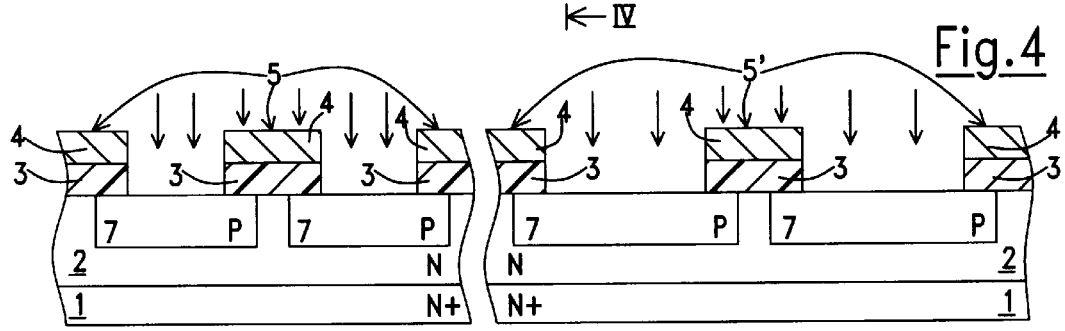
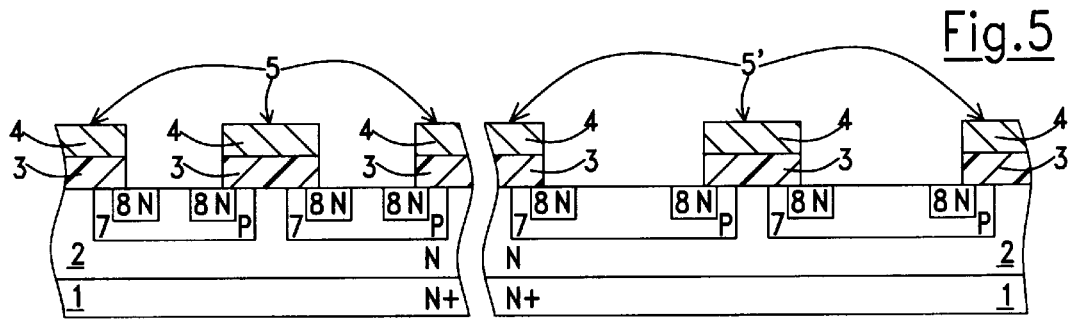

6,040,609

PROCESS FOR INTEGRATING, IN A SINGLE SEMICONDUCTOR CHIP, MOS TECHNOLOGY DEVICES WITH DIFFERENT THRESHOLD VOLTAGES

TECHNICAL FIELD

The present invention refers to a process for integrating, in a single semiconductor chip, MOS technology devices with different threshold voltages, particularly MOS transistors with vertical and/or horizontal current flux.

BACKGROUND OF THE INVENTION

Known solutions for integrating in a single semiconductor chip MOS devices with different threshold voltages provide for varying the thickness of the gate oxides, or the dopant concentrations in the channel regions of the MOS transistors. For example, if horizontal MOS transistors with different threshold voltages are to be integrated in the same chip, it is necessary to perform as many selective dopant implantations as the different values of the threshold voltages to be obtained, with each implantation having a respective dopant dose and involving only the channel regions of those MOS transistors having the same threshold voltage. Alternatively, the horizontal MOS transistors can be formed inside respective doped semiconductor wells, each well having a different dopant concentration, which are formed in a common semiconductor substrate.

If instead of acting on the dopant concentrations in the channel regions one acts on the thickness of the gate oxides, as many steps of growth and selective removal of oxide layers are necessary as the different values of the threshold voltages to be obtained.

Similar considerations are valid also for vertical MOS transistors. The known processes for the fabrication of vertical MOS transistors provides for the formation, on a lightly doped drain layer, for example, of N-type, of a gate electrode, and the selective introduction in the drain layer of a dopant (of P-type in this example) using the gate electrode as a mask for the formation of the so-called body regions of the transistor; such body regions extend under the gate electrode to form a channel region of the transistor. In order to integrate in a single chip vertical MOS transistors with different threshold voltages, it is necessary to perform, for each transistor, a dedicated dopant implantation so as to form body regions with different dopant concentrations or, if one wishes to act on the thickness of the gate oxides, to provide as many steps of growth and selective removal of oxide layers as the different values of the threshold voltage to be obtained.

This obviously makes the manufacturing processes longer, more complex and thus more costly.

SUMMARY OF THE INVENTION

The present invention provides a process for the integration in a single semiconductor chip of MOS devices having different threshold voltages, such a process not requiring as far as possible additional manufacturing steps with respect to the known processes for the fabrication of MOS devices.

According to the present invention, such an object is achieved by means of a process for integrating in a same MOS technology devices with different threshold voltages.

At least two gate electrodes for at least two MOS devices are simultaneously formed on a semiconductor material layer, said gate electrodes comprising substantially rectilinear portions and corners, each gate electrode having a respective corner density per unit area. A dopant is selectively introduced in the semiconductor material layer for the simultaneous formation of respective channel regions for said at least two MOS devices, said channel regions extending under the respective gate electrode, with said selective introduction using as a mask the respective gate electrodes so that said channel regions have, at the corners of the respective gate electrode, a dopant concentration lower than that at the substantially rectilinear portions, and said two MOS devices consequently have respective threshold voltages that depend on the corner density for a unit area and on the aperture angles of the corner of the respective gate electrodes.

Thanks to the present invention, it is possible to integrate simply and economically in a single semiconductor chip MOS devices having different threshold voltages. In the case that at least one of the MOS devices to be integrated in the chip is a MOS transistor with vertical current flux, the process according to the invention does not require any additional process step with respect to the known processes: in fact, the step b) of the process that provides for selectively introducing dopant for the formation of the channel region coincides with the step normally provided for the formation of the body region of the MOS transistors in the drain layer; the threshold voltage of the MOS transistors can thus be adjusted acting only on the geometry of the gate electrode, i.e., on the density of corners for unit area and/or on the aperture angle of the corners.

If one or more horizontal MOS transistors are to be integrated in the same chip together with vertical MOS transistors, in addition to the formation of a well of conductivity type opposite to the drain layer, as in the conventional processes, the process according to the invention provides, compared to the known manufacturing processes, a step of selective introduction of dopant using as a mask the gate electrode. However, since this step is already provided for the formation of the vertical MOS transistor(s), in the case where vertical MOS transistors are formed in the same chip, the process according to the invention does not require any additional manufacturing step, but only the definition of the gate electrodes with a suitable geometry.

Finally, if the MOS devices to be integrated in the same chip are only horizontal MOS transistors, the process according to the invention allows, by means of the addition of only one step with respect to the conventional processes for the manufacturing of MOS devices (i.e., the step of implanting dopant in a self-aligned way to the gate electrodes), to obtain as many threshold voltage values as desired, changing only the geometry of the gate electrodes of the different MOS transistors.

The features and advantages of the present invention will be made apparent by the following detailed description of two practical embodiments thereof, illustrated as non-limiting examples in the annexed drawings, wherein:

BRIEF DESCRIPTION OF THE DRAWINGS

FIG. 2 shows a first step of a manufacturing process according to one embodiment of the invention for the integration in a same semiconductor chip of at least two vertical MOS transistors with different threshold voltages.

FIG. 3 is a top-plan view of two portions of a semiconductor chip according to one embodiment of the invention wherein there are respectively integrated two vertical MOS transistors with different threshold voltages.

FIG. 4 is a further step of the process according to one embodiment of the invention.

FIG. 5 is a further step of the process according to one embodiment of the invention.

DETAILED DESCRIPTION OF THE INVENTION

Figure 1:
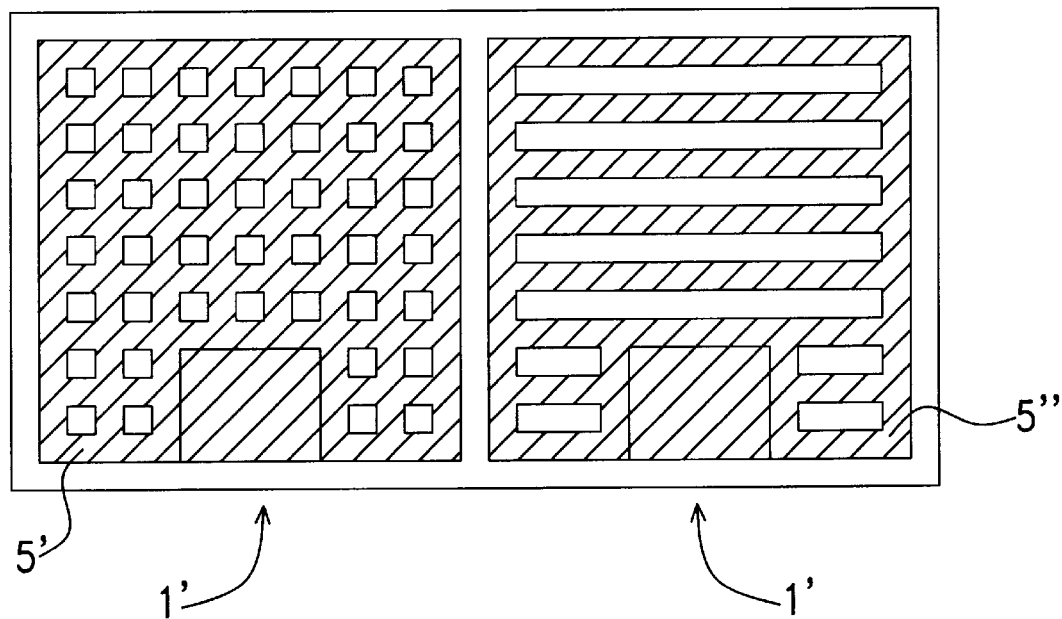
FIG. 1 is a schematic top-plan view of a semiconductor chip according to one embodiment of the invention wherein two vertical MOS transistors are integrated having different threshold voltages.

FIG. 1 shows, in top-plan view, a semiconductor chip according to one embodiment of the invention wherein two vertical MOS transistors 11, 21 are integrated having different threshold voltages. Transistors of this type are generally formed by a plurality of polygonal elementary cells, both square and rectangular, or alternatively by a plurality of stripes. In the shown example, transistor 11 is formed by square cells, while transistor 21 is formed by stripes.

FIGS. 2–5, show several aspects of a process according to one embodiment of the present invention for the integration in a single semiconductor chip of two vertical MOS transistors with different threshold voltages. Referring to FIG. 2, the process provides for epitaxial growth, on a heavily doped semiconductor substrate 1, of a generally lightly doped semiconductor layer 2 of the same conductivity type, e.g., N-type, forming together with substrate 1 the drain of transistors 11 and 21. A gate oxide layer 3 and a polysilicon layer 4 are subsequently formed for creating respective gate electrodes 5 and 25 (shown in FIGS. 3–5) of transistors 11 and 21. These electrodes 5, and 25 are defined by means of a selective removal of layers 3 and 4, so as to define in layers 3, 4 openings that are square in the case of transistor 11, and in the form of stripes in the case of transistor 21, as shown in FIG. 3. In a subsequent step (As shown in FIG. 4, a P-type dopant is selectively introduced into the drain layer 2, using the gate electrodes 5, and 25 as a mask, for the formation of body regions 7 and 27 of transistors 11 and 21, respectively. In the shown embodiment the body regions 7 and 27 have the shape of squares and stripes, and extend under the gate electrodes 5, and 25, respectively, to form the channel regions of the transistors. Other geometric configuration for the body region 7 and 27 and gate electrodes, 5, and 25 may also be used.

As shown in FIG. 5, using again the gate electrodes 5, and 25 as a mask, an N-type dopant is selectively introduced in the body regions 7 and 27 to form source regions 8.

The steps for forming the short-circuit between the body regions and the source regions, for realizing the insulation of the gate electrodes 5, 25, for opening contacts, for forming metallization lines and for finally passivating the whole chip are then performed in a conventional manner.

Referring now to FIG. 3, wherein two portions of the chip are shown in top-plan view, said portions having substantially a same area, the dimensions of the opening in the gate electrode 5 of transistor 11 are L11, L21, with L11=L21 in the case of square openings, and the distance between two adjacent openings is S. In contrast, for transistor 21 which will have a higher threshold voltage, such apertures have dimensions L12, L22, with L22>>L21. In one embodiment L12=L11, while the distance between two adjacent openings is still equal to S.

The threshold voltage of the MOS transistors varies depending on the geometry of the gate electrodes which act as a mask for the selective introduction of the P-type dopant. In fact, at the corners of the gate electrode 5, 25 the dopant concentration in the channel region is lower than that at the rectilinear portions of the gate electrode. (Darwish et al., "Transient Enhanced Threshold Shift in PWRMOS Transistors", IEDM).

Figure 6:
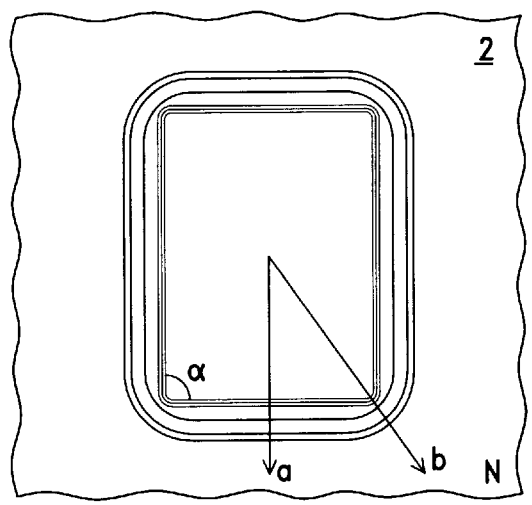
FIG. 6 is an enlarged top-plan view of a cell of the vertical MOS transistor, wherein there are shown lines of equal dopant concentration in the channel region of the transistor.

Referring to FIG. 6, showing the doping profiles as lines of equal dopant concentrations in the channel region of a generic rectangular cell of a transistor, it can be noted that the dopant concentration in the channel region near the corners of the gate electrode will be lower than that near the rectilinear regions. In fact, near the corners there is a portion of greater volume for the dopant diffusion. For example, at a point at the lower right hand corner of the cell, the dopant has only 90 degrees of area within which direct implantation may occur. The remaining area is masked by the gate electrode 5, or 25 FIGS. 3–5). In contrast, at a point along the rectilinear portion of the cell, the dopant has 180 degrees of area within which direct implantation may occur. Similarly, the remaining area is masked by the gate electrode 5, and/or 25 (FIGS. 3–5). The remaining areas around each point that do not receive direct implantation are typically doped by diffusion, which results in a lower doping level than the portions directly implanted. In other words, there is a large volume of silicon for diffusion of dopants near the corners than along the edge. Thus, varying amounts of the channel are masked from direct implantation by the gate electrode 5 and/or 25 with increased area exposed for direct implantation resulting in a corresponding higher concentration of dopant. Furthermore, the more the angle α formed by the corner of the gate electrode is acute, the less area is exposed for direct implantation of dopant, and the lower the dopant concentration in the channel region. Thus, the geometry of the gate electrode affects the dopant concentration within the channel region of the transistor.

Figure 7:
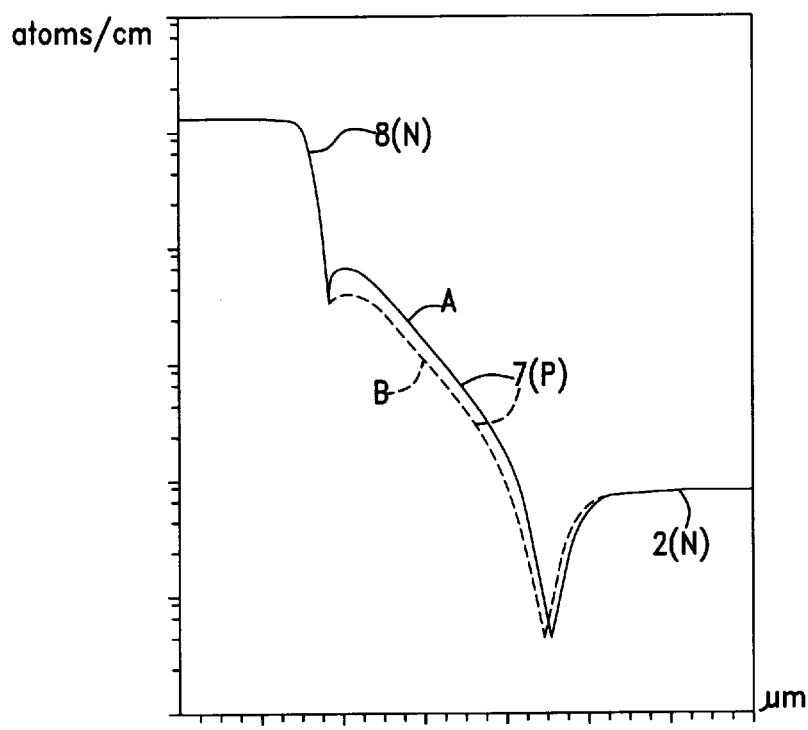
FIG. 7 shows the surface doping profiles along directions a and b from FIG. 6.

Referring to FIG. 7, curve "A" in solid shows the surface dopant concentration profile in the channel region along a rectilinear portion of the gate electrode (direction A in FIG. 6), while the dashed curve "B" shows the concentration profile in the channel region near the corner of the gate electrode (direction B in FIG. 6). It appears that the peak dopant concentration in the channel region near gate electrodes comprising substantially rectilinear portions is higher than that in the channel region near the corners thereof. Thus, the peak dopant concentration depends on the geometry of the gate electrode, and therefore the threshold voltage of the vertical MOS transistor depends on the geometry of the gate electrode.

In each device two areas exist with different threshold voltages: the corners and the rectilinear regions. Given that the dopant concentration in the channel affects the threshold voltage of a transistor, and that the dopant concentration corresponds to the corner/rectilinear geometry (corner density) of the gate electrode near the channel, it follows that the threshold voltage depends on the corner density per unit area. As the corner density of the gate electrode of the transistor increases, the concentration of the dopant in the channel decreases, and vice versa. Thus, transistors having higher corner densities per unit area will have lower threshold voltages and vice versa.

In the case of structures with generally rectangular cells (rectangular openings in the gate electrode), the corner density per unit area D is proportional to the length of the sides $L_{longer}$, $L_{shorter}$ of the transistor's cells (openings in the gate electrode), and is:

$$D = D_{max} \cdot \frac{L_{shorter} + S}{L_{Longer} + S}, \quad (1)$$

where $D_{max}$ is the maximum corner density per unit area corresponding to the case of square cells and S is the spacing between cells equal to S.

Thus, for a square cell with $L_{shorter}=L_{longer}$, the gate electrode of transistor 11 has, in the shown example, a corner density per unit area of:

$$D_{11} = D_{max} \cdot \frac{L11 + S}{L21 + S} = D_{max}. \quad (2)$$

Because the transistor 11 has a square cell, $D_{11}=D_{max}$. The gate electrode of transistor 21 with a stripe layout (which can be considered rectangular cells with $L_{longer} \gg L_{shorter}$) has a corner density per unit area of:

$$D_{21} = D_{max} \cdot \frac{L12 + S}{L22 + S} \ll D_{max}. \quad (3)$$

Thus, with L22>>L21m, it follows that $D_{11}>D_{21}$. For this reason, since transistor 11 has a higher corner density, it will conduct the prescribed current at a lower voltage applied to the gate electrode.

Figure 8:
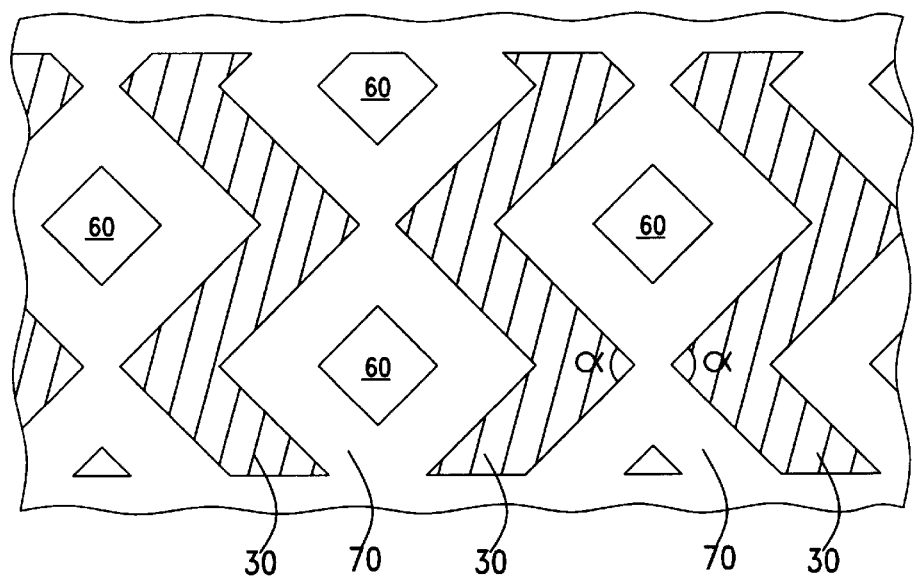
FIG. 8 is a top-plan view of a portion of a semiconductor chip according to one embodiment of the invention having vertical MOS transistors, with gate electrodes in a serpentine form.
Figure 9:
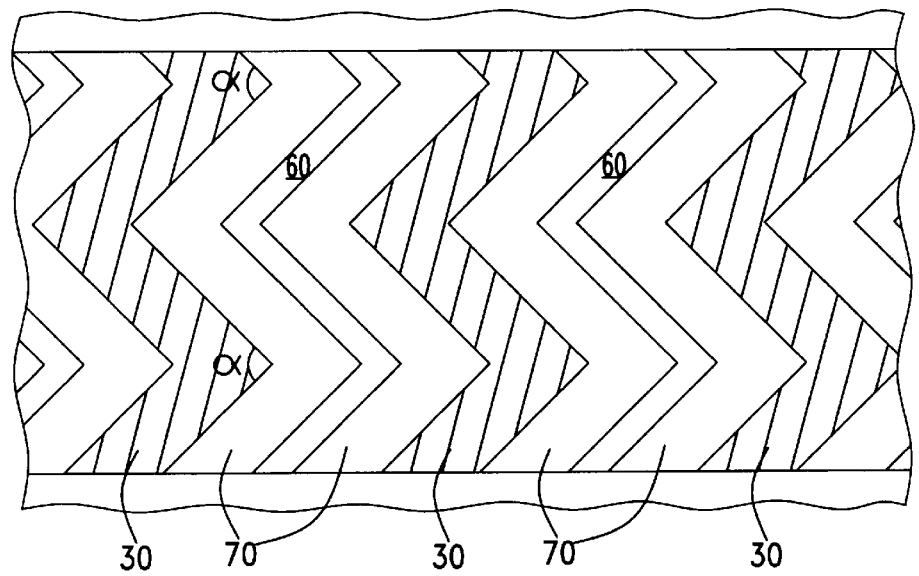
FIG. 9 is a top-plan view of a portion of a semiconductor chip according to one embodiment of the invention having vertical MOS transistors, with gate electrodes in a serpentine form.
Figure 10:
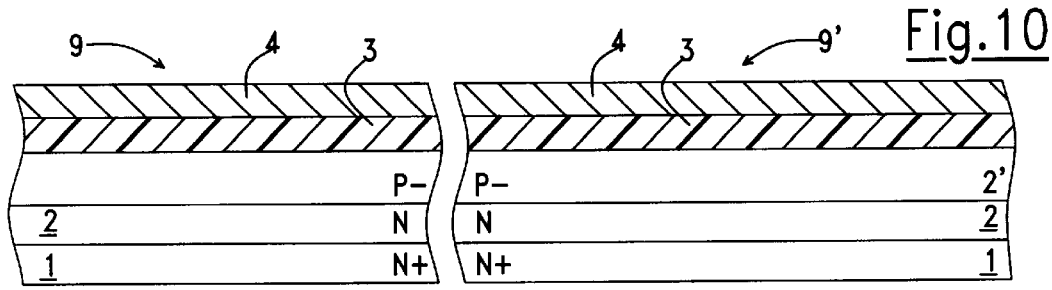
FIG. 10 shows a first step of a process according to one embodiment of the invention for the integration in a same semiconductor chip of at least two horizontal MOS transistors with different threshold voltages.
Figure 11:
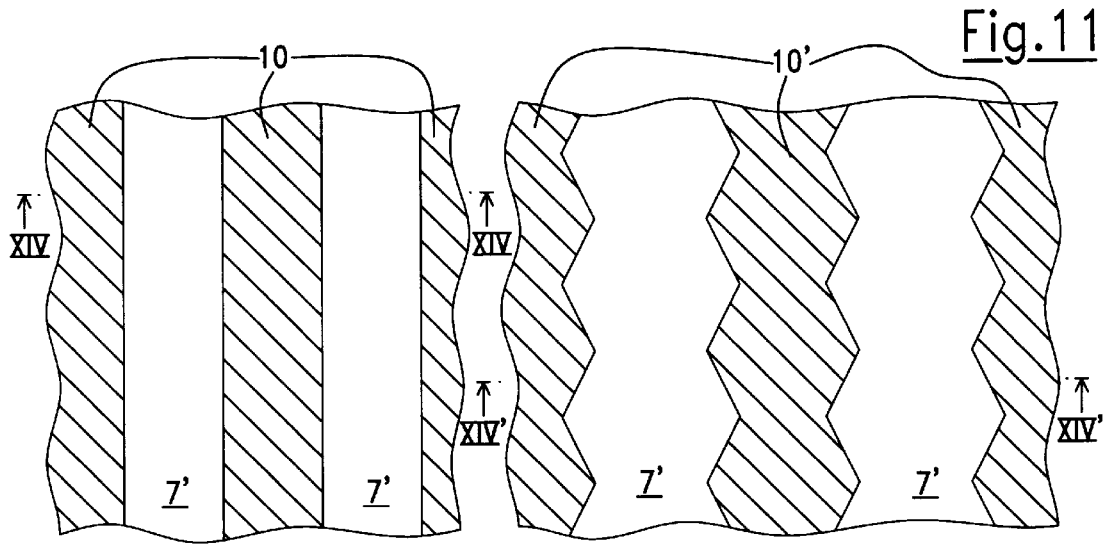
FIG. 11 is a top-plan view of two portions of a semiconductor chip according to one embodiment of the invention wherein there are respectively integrated two horizontal MOS transistors with different threshold voltages.
Figure 12:
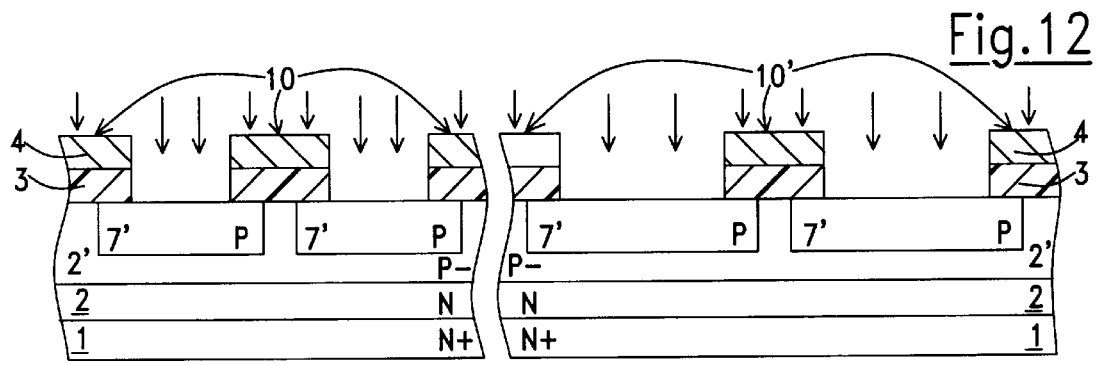
FIG. 12 shows a further step of the process according to one embodiment of the invention for the integration of the two horizontal MOS transistors with different threshold voltages.
Figure 13:
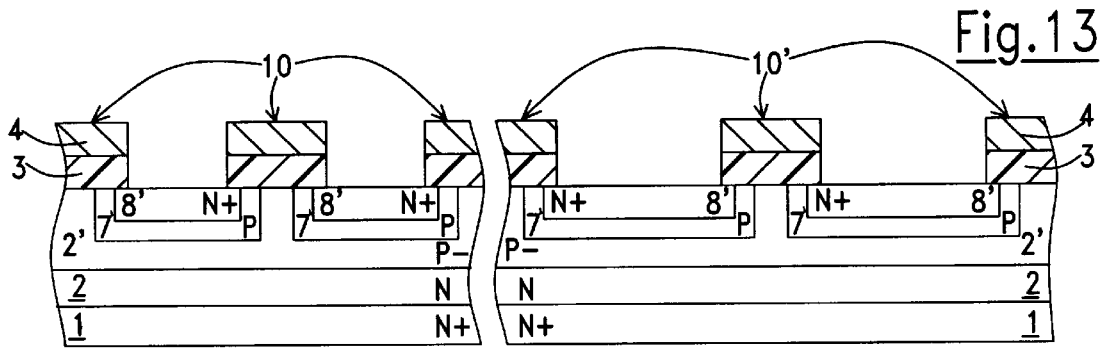
FIG. 13 shows a further step of the process according to one embodiment of the invention for the integration of two horizontal MOS transistors with different threshold voltages.

Further examples of layouts of vertical MOS transistors, wherein the gate electrodes have a stripe layout, are shown in FIGS. 8 and 9. In these embodiments the gate electrodes 30 of the transistors are stripes of constant width, but have a serpentine geometry.

In the embodiment of FIG. 8 the body regions 60 take a rhomboidal shape, while in the embodiment of FIG. 9 the body regions 60 have a serpentine geometry.

Also in these embodiments, source regions 70 are formed inside the body regions 60 so as to leave at least a central portion of the body regions for the contact of short-circuit to the source regions by means of a metallization layer.

These embodiments allow extremely high corner densities per unit area, with the further advantage of allowing the angle α of the corners of the gate electrodes of the transistors integrated in the same chip to vary. The angle α can be varied from a maximum of 180°, for which the gate electrode becomes a stripe substantially free of corners, to a minimum determined by optical resolution of the photolithographic equipment employed, to achieve the maximum corner density per unit area.

FIGS. 10–13 show steps of a process according to another embodiment of the invention for the integration in a single chip two horizontal (or lateral) MOS transistors with different threshold voltages. In this embodiment, reference is made in particular to the process previously described for the integration in the same chip of two vertical MOS transistors with different threshold voltages. The shown embodiment provides for epitaxially growing, on a heavily doped semiconductor substrate 1 of a lightly doped semiconductor layer 2 of the same conductivity type as the substrate, preferably N type, but P type could be used. A lightly doped P-semiconductor layer 22 is formed, constituting the substrate of horizontal MOS transistors 19 and 29. An oxide layer 3 and a polysilicon layer 4 are then formed for creating the gate electrodes 10 and 20. The electrodes 10 and 20 are defined by means of a selective removal of layers 3, 4. In a subsequent step a P-type dopant is selectively introduced in the substrate layer 22 using the gate electrodes 10 and 20 as a mask, for the creation of P-type regions 17 and 37 extending under the gate electrodes 10, 20.

Using again the gate electrodes 10 and 20 as a mask, an N-type dopant is selectively introduced in the P-type regions 17 and 37 for creating N+ source and drain regions 18, 28.

The steps for the isolation of the gate electrode, for the opening of contacts, for the formation of metallization lines and for the final passivation of the whole chip may be performed in a conventional manner to complete the formation and contact to horizontal MOS transistors in FIGS. 10–13.

Advantageously, when the process according to one embodiment of the invention is used to integrate in the same chip both vertical and horizontal MOS transistors, the implantation for the formation of the P-type regions 17 and 37 in the P-well 22 of the horizontal MOS transistors is simultaneous with the formation of the body regions 7 of the vertical MOS transistors.

Figure 14:
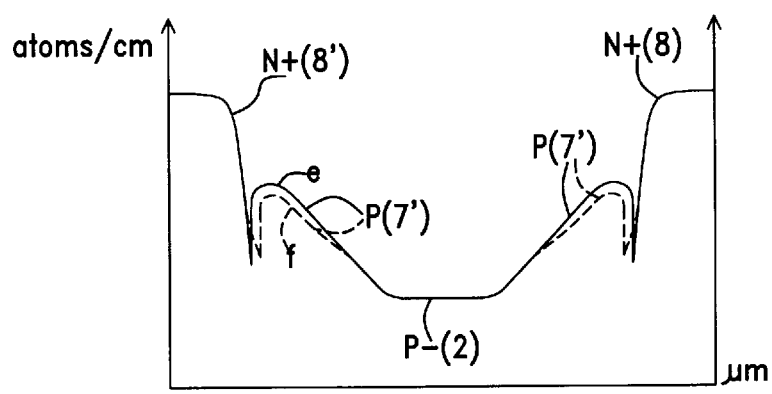
FIG. 14 shows surface doping profiles along sections XIV—XIV and XIV'—XIV' of FIG. 11.

In FIG. 14 the solid curve "e" shows the dopant concentration profile along the channel region near a rectilinear gate electrode 10, while the dashed curve "f" shows the dopant concentration profile along the channel region near a corner of the gate electrode. Again, the dopant concentration is generally lower in the channel region near a corner of a gate electrode. Conversely, the dopant concentration is relatively higher away from corners of a gate electrode. Thus, because varying dopant concentration in the channel region affects the threshold voltages of the transistor, transistors having different threshold voltages may be created in a single semiconductor chip by varying the geometry of the gate electrode.

The process according to one embodiment of the invention can also be advantageously applied to horizontal transistors because, by changing the density and the angle of aperture of the corners of the gate electrode it is possible to obtain transistors with different threshold voltages without additional process steps.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A process for integrating in a same MOS technology devices with different threshold voltages, comprising:

simultaneously forming on a semiconductor material layer of at least two gate electrodes for at least two MOS devices, said gate electrodes comprising substantially rectilinear portions and corners, each gate electrode having a respective corner density per unit area; and selectively introducing in the semiconductor material layer a dopant for the simultaneous formation of respective channel regions for said at least two MOS devices, said channel regions extending under the respective gate electrode, said selective introduction using as a mask the respective gate electrodes so that said channel regions have, at the corners of the respective gate electrode, a dopant concentration lower than that at the substantially rectilinear portions, and said two MOS devices consequently have respective threshold voltages that depend on the corner density per unit area and on the aperture angles of the corner of the respective gate electrodes.

2. The process of claim 1 wherein said selective introduction of dopant comprises dopant implantation performed using as a mask the gate electrodes, and a subsequent diffusion of the dopant.

3. The process of claim 1 wherein said MOS technology power devices are vertical MOS transistors.

4. The process of claim 1 wherein said MOS technology power devices are horizontal MOS transistors.

5. The process of claim 1 wherein said MOS technology devices integrated in the same semiconductor chip are vertical and horizontal MOS transistors.

6. A semiconductor chip having at least two integrated MOS devices with different threshold voltages, each one comprising a respective gate electrode superimposed over a respective channel region, each gate electrode comprising substantially rectilinear portions and corners, and respective source and drain electrodes separated by said channel region, wherein said threshold voltages of the two MOS devices depends on the corner density per unit area and on the aperture angles of the corners of each gate electrode.

7. A method for creating devices disposed on a single semiconductor material having different threshold voltages, comprising:

forming a first gate electrode overlaying the semiconductor material, the first gate electrode having a first corner density and an aperture angle for each corner;

forming a second gate electrode overlaying the semiconductor material substantially simultaneously with the forming of the first gate electrode, the second gate electrode having a second corner density and an aperture angle for each corner, at least one of the second corner density and aperture angle for a corner of the second gate electrode being respectively different than the first corner density and aperture angle for the first gate electrode; and doping the semiconductor material with a dopant in areas not overlaid by the first and second gate electrodes, the dopant being disposed at least in part in portions of the semiconductor material overlaid by the first and second gate electrode, a concentration of the dopant in the semiconductor material overlaid by the first and second gate electrodes respectively corresponding to the corner density and aperture angle of corners of the first and second gate electrodes, the threshold voltage of the devices respectively corresponding to the dopant concentrations of the semiconductor material overlaid by the first and second gate electrodes.

8. The method of claim 7 wherein doping the semiconductor material comprises:

implanting the dopant into portions of the semiconductor material not overlaid by the first and second gate electrodes; and diffusing the dopant into portions of the semiconductor material overlaid by the first and second gate electrodes.

9. The method of claim 7 wherein the first and second gate electrodes comprise gate electrodes for horizontal transistors.

10. The method of claim 7 wherein the first and second gate electrodes comprise gate electrodes for vertical transistors.

11. The method of claim 7 wherein the first and second gate electrodes comprise gate electrodes for a horizontal transistor and a vertical transistor respectively.

12. The method of claim 7 wherein the aperture angles comprise angles less than or equal to 180 degrees.

13. The method of claim 7, further comprising:

forming a source and a drain for each of the devices.

14. The method of claim 7 wherein the portion of the semiconductor material having the dopant that is overlaid by the first and second gate electrodes comprises conducting channels of transistors.

15. A method for doping a semiconductor material with varying doping concentrations, comprising:

determining a doping profile for the semiconductor material;

matching a geometry of a mask to the doping profile, the mask having a relatively high corner density per unit area in a portion of the semiconductor material that is to have a relatively low doping concentration and having a relatively low corner density per unit area in a portion of the semiconductor material that is to have a relatively high doping concentration;

masking the semiconductor material with the mask;

implanting a dopant into portions of the semiconductor material not covered by the mask; and diffusing the dopant into portions of the semiconductor material covered by the mask, the doping concentration of the diffused dopant corresponding to the corner density per unit area of the mask.

16. The method of claim 15 wherein the corner density comprises the number of corners per unit area.

17. The method of claim 15 wherein the corner density corresponds to aperture angles of the respective corners of the mask.

18. The method of claim 17 wherein the aperture angles comprise angles less than or equal to 180 degrees.

* * * * *